(12) United States Patent
Egerer

(10) Patent No.: US 7,405,991 B2
(45) Date of Patent: Jul. 29, 2008

(54) SEMICONDUCTOR DEVICE VOLTAGE SUPPLY FOR A SYSTEM WITH AT LEAST TWO, ESPECIALLY STACKED, SEMICONDUCTOR DEVICES

(75) Inventor: Jens Egerer, München (DE)

(73) Assignee: Infineon Technologies AG, Munich (DE)

( * ) Notice: Subject to any disclaimer, the term of this patent is extended or adjusted under 35 U.S.C. 154(b) by 474 days.

(21) Appl. No.: 10/812,395

(22) Filed: Mar. 30, 2004

(65) Prior Publication Data

US 2005/0017341 A1    Jan. 27, 2005

(30) Foreign Application Priority Data

Apr. 2, 2003    (DE) ............................... 103 15 303

(51) Int. Cl.
*H02J 3/00* (2006.01)
*G11C 5/14* (2006.01)
*H01L 23/02* (2006.01)

(52) U.S. Cl. .................... 365/229; 307/38; 257/686

(58) Field of Classification Search ............... 307/140, 307/36; 365/226, 227, 222, 229; 257/686, 257/291
See application file for complete search history.

(56) References Cited

U.S. PATENT DOCUMENTS

| 5,508,653 | A | * | 4/1996 | Chu et al. | 327/519 |
| 5,687,108 | A | * | 11/1997 | Proebsting | 365/51 |
| 5,758,100 | A | * | 5/1998 | Odisho | 710/301 |
| 5,903,607 | A | | 5/1999 | Tailliet | |
| 6,600,220 | B2 | * | 7/2003 | Barber et al. | 257/685 |
| 2004/0094820 | A1 | * | 5/2004 | Nishikawa et al. | 257/502 |
| 2005/0189566 | A1 | * | 9/2005 | Matsumoto et al. | 257/200 |

FOREIGN PATENT DOCUMENTS

| DE | 3806951 C2 | 9/1988 |
| DE | 19648492 A1 | 11/1997 |
| EP | 0736903 A2 | 10/1996 |

* cited by examiner

*Primary Examiner*—Michael J Sherry
*Assistant Examiner*—Michael Rutland Wallis
(74) *Attorney, Agent, or Firm*—Slater & Matsil, L.L.P.

(57) ABSTRACT

The invention is directed to a system and method comprising a first semiconductor device and a second semiconductor device, wherein the first semiconductor device comprises a voltage supply means, characterized in that the voltage supply means of the first semiconductor device is connected to the second semiconductor device, so that the voltage supply means of the first semiconductor device can provide a supply voltage for the second semiconductor device.

29 Claims, 1 Drawing Sheet

SEMICONDUCTOR DEVICE VOLTAGE SUPPLY FOR A SYSTEM WITH AT LEAST TWO, ESPECIALLY STACKED, SEMICONDUCTOR DEVICES

This application claims priority to German Patent Application DE 10315303.9, which was filed Apr. 2, 2003.

TECHNICAL FIELD

The invention relates to a system with two—especially stacked—semiconductor devices and a semiconductor device voltage supply for such a system, respectively.

BACKGROUND

Semiconductor devices, in particular memory devices such as DRAMS (DRAM=Dynamic Random Access Memory or dynamic read-write-memory, respectively) in general comprise one or several voltage supply means.

A voltage supply means serves to generate, from an—externally provided—voltage, a voltage used internally in the semiconductor device.

The voltage level of the internal voltage generated by the semiconductor device voltage supply means may differ from the level of the external voltage.

In particular, the internally used voltage level may be lower than the externally used voltage level.

An internal voltage level that is reduced vis-à-vis the externally used voltage level has, for instance, the advantage that the power loss in the semiconductor device can be reduced.

Furthermore, the external voltage may be subject to relatively strong fluctuations. Therefore, a so-called voltage regulator is frequently used as voltage supply means, which—in order that the device may be operated without fault—converts the external voltage into an internal voltage that is subject to relatively minor fluctuations only and is regulated at a particular, constant (possibly reduced) value.

Conventional voltage regulators may, for instance, comprise a differential amplifier and a field effect transistor. The gate of the field effect transistor may be connected to an output of the differential amplifier, and the source of the field effect transistor may e.g. be connected to the external voltage.

A reference voltage—which is subject to relatively minor fluctuations only—is applied to the positive input of the differential amplifier. The voltage output at the drain of the field effect transistor may be fed back to the negative input of the differential amplifier directly, or e.g. by the interposition of a voltage divider.

The differential amplifier regulates the voltage available at the gate connection of the field effect transistor such that the (fed back) drain voltage—and thus the voltage output by the voltage regulator—is constant and as high as the reference voltage, or e.g. by a certain factor higher.

Semiconductor devices are usually incorporated in appropriate housings, e.g. appropriate surface mountable housings (SMD housings) or plug mountable housings (e.g. corresponding Dual-In-Line (DIL) housings, Pin-Grid-Array (PGA) housings, etc.).

In one single housing, there may also be arranged two or more semiconductor devices instead of only one single semiconductor device.

In the case of memory devices, in particular DRAMs for increasing the storage density, several semiconductor devices may, for instance, be mounted in a stacked manner in one single housing.

For instance, two 256 Mbit memory devices may be provided in one single housing, this effecting a 512 Mbit chip.

The semiconductor devices, in particular memory devices, provided in one single housing comprise voltage supply means that are independent of one another.

When a memory device is accessed (i.e. when corresponding external data are stored on the memory device, or when data that are stored on the memory device are read out), there will flow, in general, relatively high currents that are generated by the corresponding voltage supply means.

Contrary to this, only relatively low currents will flow in standby or refresh operaation (e.g. for supplying leakage currents or operating currents).

The standby or refresh currents each may, for instance, be in the range of apporx. 50 µA—i.e. amount to a total of 100 µA in the case of e.g. two stacked memory devices (with the operating currents of the respective voltage supply means constituting the major part of these currents).

BRIEF SUMMARY OF THE INVENTION

It is an object of the invention to provide a novel system with two—especially stacked—semiconductor devices, and—in particular—a semiconductor device voltage supply for such a system, respectively.

The invention achieves this and further objects by the subject matter of claim 1.

Advantageous further developments of the invention are indicated in the subclaims.

In accordance with a basic idea of the invention, a system, in particular a semiconductor device system, is provided, comprising a first semiconductor device, and a second semiconductor device, wherein the first semiconductor device comprises a voltage supply means, and wherein the voltage supply means of the first semiconductor device is connected to the second semiconductor device, so that the voltage supply means of the first semiconductor device can provide a supply voltage for the second semiconductor device.

It is of particular advantage when the second semiconductor device additionally also comprises a voltage supply means.

Preferably, in a first operating mode of the second semiconductor device, the voltage supply means of the second semiconductor device provides the voltage supply for the second semiconductor device, and in a second operating mode of the second semiconductor device—in particular in a standby or refresh mode—, this is effected by the voltage supply means of the first semiconductor device.

The voltage supply means of the second semiconductor device may then be deactivated, so that the operating current thereof may be saved (and thus, altogether, the currents required for operating the semiconductor devices).

In an advantageous development of the invention, the first semiconductor device and the second semiconductor device are arranged in one and the same housing.

Preferably, the first and second semiconductor devices are arranged in the housing in a stacked manner.

Advantageously, the housing may be a plug mountable semiconductor device housing, or e.g. a surface mountable semiconductor device housing.

It is particularly preferred when the first and/or the second semiconductor devices are corresponding memory devices, in particular corresponding DRAM memory devices.

In an advantageous development of the invention, the voltage supply means of the first semiconductor device is connected to a corresponding pad of the first semiconductor device.

Preferably, the pad of the first semiconductor device is connected to a corresponding pad of the second semiconductor device, which the voltage supply means of the second semiconductor device can be connected to.

The pad of the first semiconductor device may, for instance, be connected directly to the corresponding pad of the second semiconductor device, in particular by means of an appropriate bonding wire.

Alternatively, the pad of the first semiconductor device may, for instance, also be connected to the corresponding pad of the second semiconductor device indirectly, e.g. via an interposer.

BRIEF DESCRIPTION OF THE DRAWINGS

In the following, the invention will be explained in detail by means of several embodiments and the enclosed drawing. The drawing shows.

DETAILED DESCRIPTION OF THE INVENTION

Figure 1A:
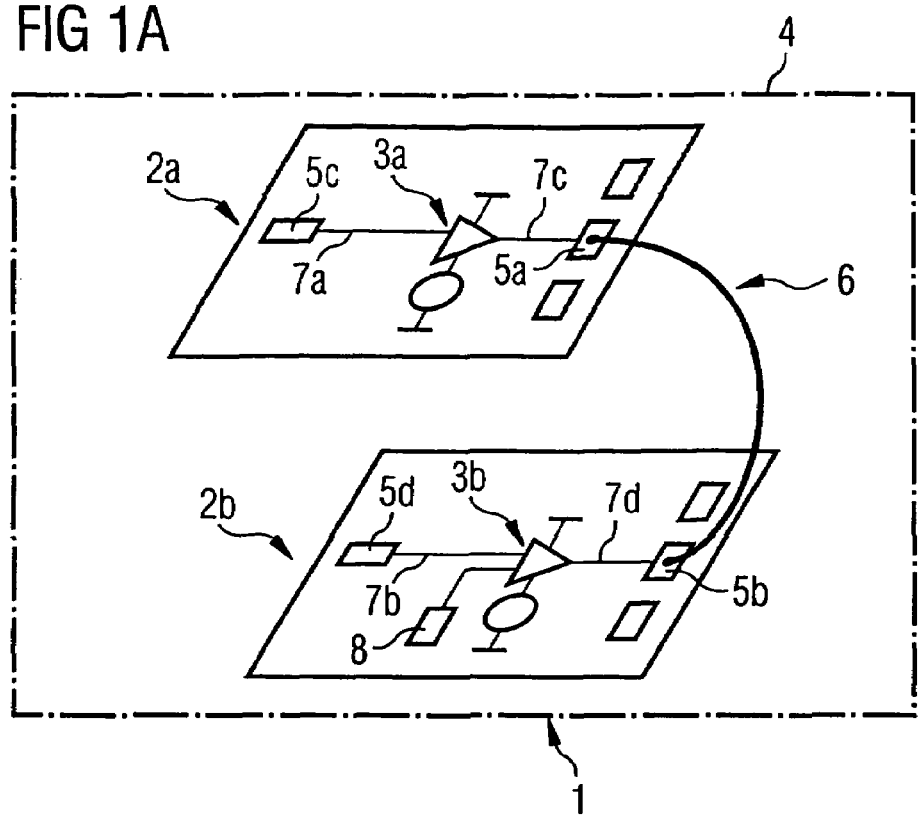
FIG. 1a is a schematic representation of a system with two stacked semiconductor devices with a semiconductor device voltage supply in accordance with a first embodiment of the present invention.

List of Reference Signs
1 semiconductor device system
2a semiconductor device
2b semiconductor device
3a voltage supply means
3b voltage supply means
4 semiconductor device housing
5a semiconductor device pad
5b semiconductor device pad
5c semiconductor device pad
5d semiconductor device pad
6 bonding wire
6a bonding wire
6b bonding wire
7a line
7b line
7c line
7d line
8 activating/deactivating control means
9 interposer
10 connection FIG. 1a is a schematic representation of a system 1 with two stacked semiconductor devices 2a, 2b in accordance with a first embodiment of the present invention.

The two semiconductor devices 2a, 2b are—apart, in particular, from the components serving for voltage supply of the semiconductor devices 2a, 2b or controlling the voltage supply, respectively, which will be explained in more detail in the following—substantially of identical structure.

The semiconductor devices 2a, 2b may, on principle, be any type of logic and/or memory devices, e.g. functional memory devices, in particular programmable logic devices (PLDs) or programmable logic arrays (PLAs), or e.g. table memory devices, in particular ROM or RAM table memory devices, etc.

For instance, appropriate DRAM table memory devices, e.g. a 256 Mbit, a 512 Mbit, or a 1 Gbit DRAM table memory device 2a, 2b, for instance appropriate DDR-DRAMs (Double Data Rate DRAMs), may be used as semiconductor devices 2a, 2b.

As is illustrated schematically in FIG. 1a, the semiconductor devices 2a, 2b are arranged in the same semiconductor device housing 4.

The housing 4 may, for instance, be an appropriate plug mountable semiconductor device housing, e.g. a Dual-In-Line (DIL) housing, a Pin-Grid-Array (PGA) housing, etc., or a surface mountable semiconductor device housing (SMD housing), etc.

As results further from FIG. 1a, the semiconductor devices 2a, 2b are mounted in the housing 4 such that they are substantially stacked.

By the stacking of the semiconductor devices 2a, 2b in the same housing 4, the system 1 can—e.g. when two 256 Mbit memory devices 2a, 2b are used as semiconductor devices 2a, 2b—altogether be used as a 512 Mbit memory device (or e.g. when two 512 Mbit memory devices are used, as a 1 Gbit memory device, etc.).

As is further illustrated in FIG. 1a, each semiconductor device 2a, 2b comprises a voltage supply means 3a, 3b having a structure similar to that of conventional voltage supply means (or—alternatively—a plurality of, e.g. two, three, four, five, six, or seven, voltage supply means having a structure corresponding to that of the voltage supply means 3a, 3b).

The voltage supply means 3a, 3b serve to generate, from an external voltage—provided by a voltage source (not illustrated) arranged externally of the semiconductor devices 2a, 2b and of the housing, respectively—a corresponding internal voltage—used, for instance, internally in the respective semiconductor device 2a, 2b (cf. explanations below).

The external voltage provided by the external voltage source may, for instance, be supplied to the voltage supply means 3a, 3b via one or a plurality of supply pins (not illustrated) of the semiconductor device housing 4, and via semiconductor device pads connected therewith (e.g. the pads 5c, 5d illustrated in FIG. 1a), as well as via corresponding lines 7a, 7b connected to the pads 5c, 5d or extending in the semiconductor devices 2a, 2b, respectively.

As voltage supply means 3a, 3b, e.g. appropriate charge pumps may be used that have a structure similar to that of conventional charge pumps, or e.g.—as in the embodiment illustrated here—voltage regulating means 3a, 3b that have a structure similar to that of conventional voltage regulating means.

These means serve to convert the external voltage—which may be subject to relatively strong fluctuations—into the above-mentioned internal voltage—which is subject to relatively minor fluctuations only and is regulated at a particular, constant value.

The internal voltage may, for instance, have substantially the same, or alternatively e.g. a lower, voltage level as/than the external voltage. The external voltage may, for instance, lie in the range of between 1.5 V and 2.5 V, e.g. at 1.8 V, and the internal voltage e.g. in the range of between 1.3 V and 2.0 V, e.g. at 1.5 V.

The voltage supply means 3a, 3b or voltage regulating means 3a, 3b, respectively, each may, for instance, comprise a differential amplifier and a field effect transistor. The gate of the field effect transistor may be connected to an output of the differential amplifier, and the source of the field effect transistor may be connected e.g. to the above-mentioned external voltage.

A reference voltage that is subject to relatively minor fluctuations only is applied to the positive input of the differential amplifier. The voltage output at the drain of the field effect transistor may be fed back to the negative input of the differential amplifier directly, or e.g. by the interposition of a voltage divider.

The differential amplifier regulates the voltage available at the gate connection of the field effect transistor such that the (fed back) drain voltage—and thus the voltage output by the corresponding voltage supply means $3a$, $3b$ or voltage regulating means $3a$, $3b$, respectively, e.g. at corresponding lines $7c$, $7d$ or connections, respectively (i.e. the above-mentioned voltage used internally on the semiconductor devices $2a$, $2b$ (internal voltage))—is constant and as high as the reference voltage, or e.g. by a certain factor higher.

The first and the second semiconductor devices $2a$, $2b$ are operated in several, different modes.

In a first mode (working mode), an external access to the first or second semiconductor device $2a$, $2b$ may, for instance, be effected (similar as with conventional memory devices). In so doing, corresponding—external—data may, for instance, be stored on the first or second semiconductor device $2a$, $2b$ (with the data being input e.g. at corresponding pins of the semiconductor device housing 4), or data stored on the first or second semiconductor device $2a$, $2b$ may be read out externally (with the data being output at corresponding pins of the semiconductor device housing 4).

A second operating mode may, for instance, be a standby mode (similar as with conventional memory devices), or, e.g. a refresh mode (also similar as with conventional memory devices).

During a refresh mode (or more exactly: during a refresh operation), the capacitors of the memory cells on which the data stored on the semiconductor devices $2a$, $2b$ are stored, are correspondingly refreshed.

A refresh cycle may be performed at regular time intervals, e.g. every 1 to 10 ms or every 10 to 1000 ms, etc.

As will be explained in more detail in the following, in the semiconductor device system 1 illustrated in FIG. 1$a$, the voltage supply means $3b$ of the second semiconductor device $2b$ is activated in the above-mentioned first operating mode (and possibly in one or several further operating mode(s))—e.g. during the above-mentioned working mode—, and in the above-mentioned second operating mode (and possibly in one or several further operating mode(s))—e.g. during the standby mode and/or during the refresh mode—the voltage supply means $3b$ of the second semiconductor device $2b$ is deactivated.

This happens e.g. by corresponding activating/deactivating signals being fed to the voltage supply means $3b$ of the second semiconductor device $2b$ by an activating/deactivating control means 8.

In the activated state, the voltage supply means $3b$ of the second semiconductor device $2b$ is switched on (is, in particular, connected to the supply or external voltage, so that corresponding operating currents—e.g. of between 20 µA and 80 µA, e.g. 50 µA—are flowing), and in the deactivated state it is switched off (is, in particular, separated from the supply or external voltage, so that corresponding operating currents are prevented from flowing).

As is further illustrated in FIG. 1$a$, the voltage supply means $3a$ of the first semiconductor device $2a$ is connected—here: via the line $7c$—to a corresponding semiconductor device pad $5a$ of the first semiconductor device $2a$.

The pad $5a$ is connected to a corresponding semiconductor device pad $5b$ of the second semiconductor device $2b$ by means of a bonding wire 6.

The pad $5b$ of the second semiconductor device $2b$ is connected—here: via the line $7d$—to the voltage supply means $3b$ of the second semiconductor device $2b$ (or to a line or a connection, respectively, at which—in the activated state of the voltage supply means $3b$ of the second semiconductor device $2b$—the internal voltage then generated thereby is output).

By the above-described connection of the voltage supply means $3a$ of the first semiconductor device $2a$ to the second semiconductor device $2b$ it is achieved that, in the above-mentioned second operating mode of the second semiconductor device $2b$ (and possibly in one or several further operating mode(s))—e.g. during the standby mode and/or during the refresh mode—, the voltage supply means $3a$ of the first semiconductor device $2a$ can, in addition to the—internal—supply voltage (internal voltage) for the first semiconductor device $2a$, provide the—internal—supply voltage (internal voltage) for the second semiconductor device $2b$.

In other words, in the above-mentioned second operating mode the voltage supply means $3a$ of the first semiconductor device $2a$ generates the respectively required (internal) voltages for both semiconductor devices $2a$, $2b$—the voltage supply means $3b$ of the second semiconductor device $2b$ is deactivated, so that the operating current thereof may be saved (this, altogether, reducing the currents required for operating the semiconductor devices $2a$, $2b$).

Contrary to this—as has already been explained above—in the above-mentioned first operating mode of the second semiconductor device $2b$ (and possibly in one or several further operating mode(s))—e.g. during the working mode—the voltage supply means $3b$ of the second semiconductor device $2b$ is put to an active state (and the voltage supply means $3a$ of the first semiconductor device $2a$ is possibly additionally separated from the voltage supply means $3b$ of the second semiconductor device $2b$, or the above-mentioned line or the connection, respectively, at which the voltage supply means $3b$ of the second semiconductor device $2b$ outputs the internal voltage generated thereby (e.g. by controlling the activating/deactivating control means 8, or alternatively e.g. a corresponding control means provided on the first semiconductor device $2a$)).

By this it is achieved that, in the above-mentioned first operating mode of the second semiconductor device $2b$ (and possibly in one or several further operating mode(s))—e.g. during the first working mode—the voltage supply means $3b$ of the second semiconductor device $2b$ provides the—internal—supply voltage (internal voltage) for the second semiconductor device $2b$ (and the voltage supply means $3a$ of the first semiconductor device $2a$ the—internal—supply voltage (internal voltage) for the first semiconductor device $2a$).

Advantageously, the first and the second semiconductor devices $2a$, $2b$ are—in particular until passing through the device function adjusting step which will be explained in more detail in the following—(at first) of substantially identical structure.

By means of the device function adjusting step it is determined during the manufacturing of the semiconductor devices whether a corresponding semiconductor device is to fulfill a function that corresponds to the function of the above-mentioned first semiconductor device $2a$, i.e. the function of a "master" which, in the above-mentioned second operating mode (and possibly in one or several further operating mode(s)), is to provide—in addition to its own voltage supply—the respectively required (internal) voltage also for one or several further semiconductor device(s), or a function corresponding to the function of the above-mentioned second semiconductor device 2b, i.e. the function of a "slave" which is to obtain, in the above-mentioned second operating mode (and possibly in one or several further operating mode(s)) the respectively required (internal) voltage from another semiconductor device ("master").

For determining the function of a corresponding semiconductor device, an appropriate device function adjusting means, in particular an appropriate fuse, may be provided on the semiconductor devices.

An appropriate laser fuse or e.g. an appropriate electrical fuse may, for instance, be used as a fuse.

When the fuse is shot, the corresponding device assumes e.g. a "master" function, and otherwise a "slave" function (or vice versa).

Figure 1B:
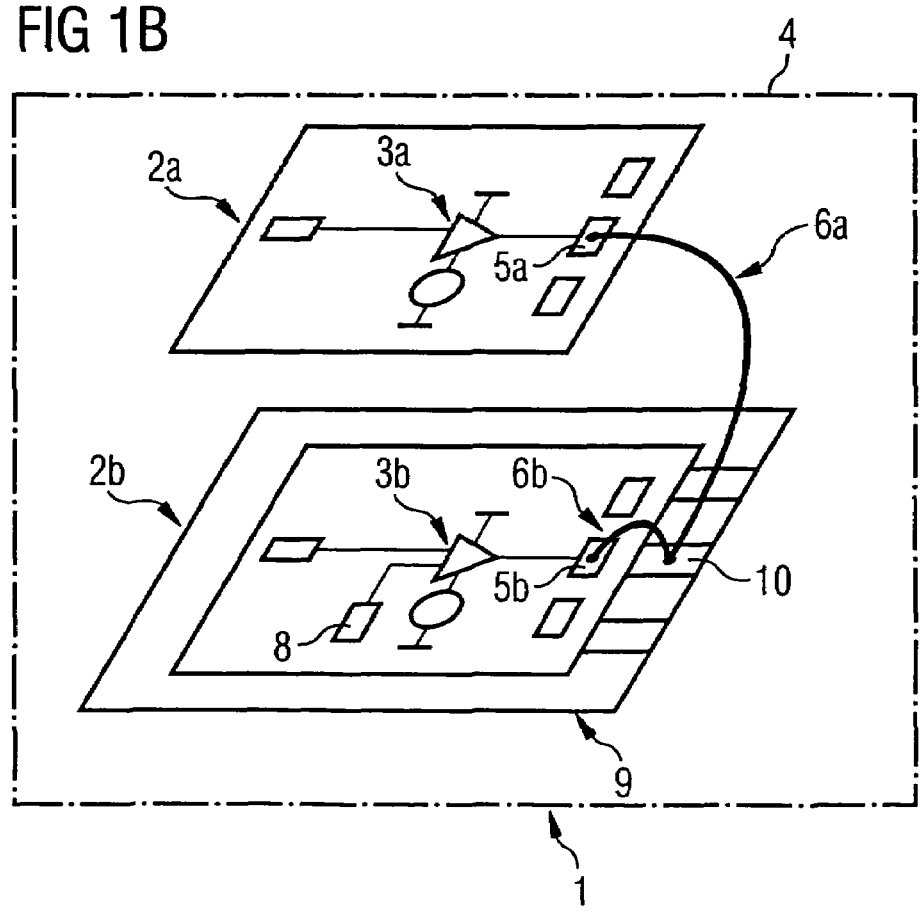
FIG. 1b is a schematic representation of a system with two stacked semiconductor devices with a semiconductor device voltage supply in accordance with a second embodiment of the present invention.

As is shown by means of the alternative embodiment for a semiconductor device system 1 illustrated in FIG. 1b, the voltage supply means 3a of the first semiconductor device 2a may also be connected in any other way than in that illustrated in FIG. 1a to the second semiconductor device 2b (or more exactly: the voltage supply means 3b of the second semiconductor device 2b (or the line or the connection, respectively, at which the voltage supply means 3b of the second semiconductor device 2b outputs the internal voltage generated thereby in the activated state).

For instance, in accordance with FIG. 1b, the voltage supply means 3a of the first semiconductor device 2a may be connected—as described above—to a semiconductor device pad 5a of the first semiconductor device 2a which—other than with the embodiment illustrated in FIG. 1a—is connected to a corresponding contact of an interposer 9 (or to a corresponding leadframe connection 10 of the housing 4) by means of a bonding wire 6.

The interposer contact (or the leadframe connection 10) is connected to the pad 5b of the second semiconductor device 2b by means of a further bonding wire 6b, which is connected to the voltage supply means 3b of the second semiconductor device 2b (or the above-mentioned line or the connection, respectively, at which—in the activated state of the voltage supply means 3b of the second semiconductor device 2b—the internal voltage then generated thereby is output).

By this it can be achieved—similar as with the embodiment illustrated in FIG. 1a—that in the second operating mode of the second semiconductor device 2b (e.g. during the standby mode and/or during the refresh mode) the voltage supply means 3a of the first semiconductor device 2a can—in addition to the voltage supply (internal voltage) for the first semiconductor device 2a—also provide the supply voltage (internal voltage) for the second semiconductor device 2b.

When—corresponding to the first embodiment—the voltage supply means 3b of the second semiconductor device 2b is correspondingly deactivated in the second operating mode, the operating current of the voltage supply means 3b can—corresponding to the embodiment illustrated in FIG. 1a—be saved in the above-mentioned second operating mode (and thus, altogether, the currents required for operating the semiconductor devices 2a, 2b).

The invention claimed is:

1. A system comprising:
   a first semiconductor device, and
   a second semiconductor device,
   wherein the first semiconductor device and the second semiconductor device each comprise a voltage supply device,
   wherein said voltage supply device of said first semiconductor device is connected to said second semiconductor device, so that said voltage supply device of said first semiconductor device can provide a supply voltage for operation of said second semiconductor device, and
   wherein the system is adapted such that, in an external access operating mode of the second semiconductor device, the voltage supply device of said second semiconductor device provides the supply voltage for operation of the second semiconductor device, and, in a standby or refresh operating mode of the second semiconductor device, the voltage supply device of said first semiconductor device provides the supply voltage for operation of the second semiconductor device.

2. The system according to claim 1, wherein said first semiconductor device and said second semiconductor device are arranged in a same housing.

3. The system according to claim 2, wherein said first and second semiconductor devices are arranged in said housing in a stacked manner.

4. The system according to claim 2, wherein said housing is a plug mountable semiconductor device housing.

5. The system according to claim 4, wherein said plug mountable semiconductor device housing is a Dual-In-Line (DIL) housing.

6. The system according to claim 4, wherein said plug mountable semiconductor device housing is a Pin-Grid-Array (PGA) housing.

7. The system according to claim 2, wherein said housing is a surface mountable semiconductor device housing.

8. The system according to claim 1, said system comprising one or several further semiconductor devices.

9. The system according to claim 8, wherein said one or said several further semiconductor device(s) is/are arranged in a same semiconductor device housing as said first and said second semiconductor devices.

10. The system according to claim 8, wherein said voltage supply device of said first semiconductor device is also connected to said one or to said several further semiconductor device(s), so that said voltage supply device of said first semiconductor device can additionally provide a supply voltage for said one or said several further semiconductor device(s).

11. The system according to claim 8, wherein said first semiconductor device comprises a further voltage supply device that is connected to said one or said several further semiconductor device(s), so that said further voltage supply device of said first semiconductor device can provide a supply voltage for said one or said several further semiconductor device(s).

12. The system according to claim 1, wherein said first and/or said second semiconductor devices, and/or said one and/or said several further semiconductor devices are memory devices.

13. The system according to claim 12, wherein said memory device is a table memory device or said memory devices are table memory devices, respectively.

14. The system according to claim 13, wherein said table memory device or said table memory devices are RAM table memory devices, respectively.

15. The system according to claim 14, wherein said RAM table memory device is a DRAM table memory device or said RAM table memory devices are DRAM table memory devices, respectively.

16. The system according to claim 13, wherein said table memory device is a ROM table memory device or said table memory devices are ROM table memory devices, respectively.

17. The system according to claim 12, wherein said memory device is or said memory devices are programmable logic devices (PLDs) and/or programmable logic arrays (PLAs).

18. The system according to claim 1, wherein said voltage supply device and/or said further voltage supply device provide a voltage supply for said first semiconductor device.

19. The system according to claim 1, wherein said voltage supply means and/or said further voltage supply means generate(s) the respective supply voltage from an external voltage.

20. The system according to claim 1, wherein said voltage supply device and/or said further voltage supply device are or comprise a voltage regulating device.

21. The system according to claim 1, wherein said voltage supply device and/or said further voltage supply device are or comprise a charge pump.

22. The system according to claim 1, wherein said voltage supply device of said second semiconductor device is activated in the first operating mode, and wherein said supply voltage device of said second semiconductor device is deactivated in the second operating mode.

23. The system according to claim 1, wherein an appropriate fuse is provided on said first and/or second semiconductor device(s), by means of which it is determined whether the corresponding semiconductor device is to assume the function of said first semiconductor device or the function of said second semiconductor device.

24. The system according to claim 1, wherein said voltage supply device of said first semiconductor device is connected to a corresponding pad of said first semiconductor device.

25. The system according to claim 24, wherein said pad of said first semiconductor device is connected to a pad which said voltage supply device of said second semiconductor device can be connected to.

26. The system according to claim 25, wherein said pad of said first semiconductor device is connected directly to the corresponding pad of said second semiconductor device by means of an appropriate bonding wire.

27. The system according to claim 25, wherein said pad of said first semiconductor device is connected indirectly to the corresponding pad of said second semiconductor device via an interposer.

28. The system according to claim 12, wherein said memory devices are functional memory devices.

29. The system according to claim 12, wherein said memory devices are fundamental memory devices.

* * * * *